United States Patent
Shao et al.

(10) Patent No.: US 8,951,883 B2
(45) Date of Patent: Feb. 10, 2015

(54) SEMICONDUCTOR DEVICE AND MANUFACTURING METHOD THEREOF

(75) Inventors: Qun Shao, Beijing (CN); Zhongshan Hong, Beijing (CN)

(73) Assignee: Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 13/345,409

(22) Filed: Jan. 6, 2012

(65) Prior Publication Data

US 2013/0049162 A1 Feb. 28, 2013

(30) Foreign Application Priority Data

Aug. 24, 2011 (CN) .......................... 2011 1 0243428

(51) Int. Cl.
 *H01L 21/76* (2006.01)
 *H01L 21/762* (2006.01)
(52) U.S. Cl.
 CPC .............................. *H01L 21/76229* (2013.01)
 USPC ......................................... 438/424; 257/506
(58) Field of Classification Search
 CPC .................................................. H01I 21/76229
 USPC ........... 438/243, 248, 424; 257/E21.548, 506
 See application file for complete search history.

(56) References Cited

U.S. PATENT DOCUMENTS

| 5,759,917 | A  | * | 6/1998  | Grover et al. ............... | 438/690 |
| 6,833,311 | B2 | * | 12/2004 | Ho et al. ..................... | 438/424 |
| 7,528,052 | B2 | * | 5/2009  | Lim et al. .................... | 438/435 |
| 2002/0055268 | A1 | | 5/2002 | Yu et al. | |
| 2003/0209760 | A1 | * | 11/2003 | Maruyama .................. | 257/347 |
| 2005/0016948 | A1 | * | 1/2005 | Yang et al. .................. | 216/13 |
| 2005/0116312 | A1 | * | 6/2005 | Lim et al. .................... | 257/499 |
| 2006/0141793 | A1 | * | 6/2006 | Anceau ....................... | 438/694 |
| 2009/0020845 | A1 | * | 1/2009 | Shin et al. ................... | 257/506 |

FOREIGN PATENT DOCUMENTS

| CN | 101290903 | 10/2008 |
| CN | 102693932 | 9/2012 |

OTHER PUBLICATIONS

Office Action from corresponding Chinese Patent Appl. No. 201110243428.5. dated Mar. 27, 2014.

* cited by examiner

*Primary Examiner* — Matthew Reames
(74) *Attorney, Agent, or Firm* — Koppel, Patrick, Heybl & Philpott

(57) ABSTRACT

A semiconductor device and a manufacturing method therefor is based on the fact that a thinner liner oxide layer on the bottom of the trenches can lead to a higher subsequent deposition rate. After forming trenches and a liner oxide layer and before depositing a filling oxide layer in the trenches, a portion of or all of the thickness of the liner oxide layer on bottom of trenches in an isolation area is removed. Removing some or all of a liner oxide layer on the bottom of trenches in an isolation area can improve the deposition rate for trenches in such that the difference in thickness can be reduced for deposited filling oxide layer between isolation area and dense area.

17 Claims, 8 Drawing Sheets

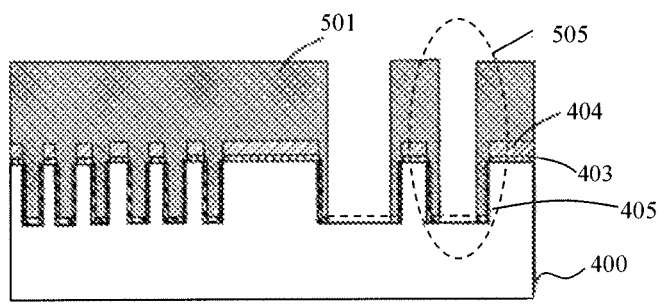
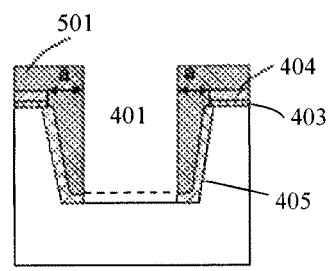
Fig. 5C Fig. 5D
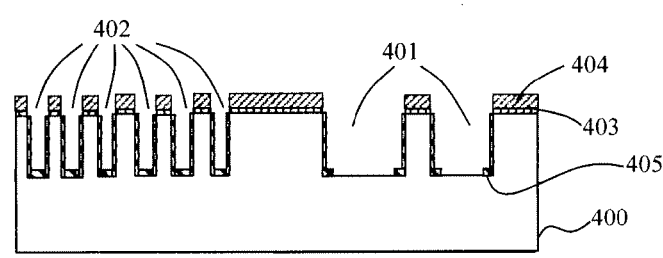
Fig. 5E

SEMICONDUCTOR DEVICE AND MANUFACTURING METHOD THEREOF

CROSS-REFERENCE TO RELATED APPLICATIONS

This application claims priority to Chinese Patent Application No. 201110243428.5, filed on Aug. 24, 2011 and entitled "Semiconductor Device and Manufacturing Method Thereof", which is incorporated herein in its entirety by reference.

BACKGROUND OF THE INVENTION

1. Field of the Invention

The present invention relates to the field of manufacturing semiconductor device, and more particularly, to a semiconductor device having a shallow trench isolation structure and a manufacturing method therefor.

2. Description of the Related Art

As there is a need for further integrated semiconductor devices, isolation techniques for electronically isolating adjacent devices become increasingly important. A shallow trench isolation process is widely used in the manufacture of highly integrated semiconductor devices.

The shallow trench isolation process can achieve effective isolation of active areas by forming isolation trenches for defining the active areas on a semiconductor substrate, and then filling up the isolation trenches with isolation materials. Generally, in a semiconductor device, active areas in some regions may have a higher density such that a trench for isolating the active areas has a smaller width, referred to as "dense areas". Active areas in some other regions may have a lower density such that trench for isolating have a larger width, referred to as "isolation areas".

FIGS. 1A-1D show a prior art method of forming a semiconductor device having a shallow trench isolation structure. First, a liner oxide layer 103 and a nitride layer 104 are formed on a semiconductor substrate 100, and isolation trenches 101 in isolation areas and isolation trenches 102 in dense areas are formed through, for example, a photolithography process, to produce the structure as shown in FIG. 1A.

Then, referring to FIG. 1B, a first insulating layer such as a liner oxide layer 105 is formed on the bottom and sidewalls of trenches 101 and 102. Then, a second insulating layer such as a filling oxide layer 106 is deposited in the trenches by means of, for example, a high aspect ratio process (HARP), to produce the structure as shown in FIG. 1C. Finally, the filling oxide outside the surface of the trenches is planarized through a chemical mechanical planarization process, to produce the structure as shown in FIG. 1D.

However, due to a conformal property of the deposition process, under the same deposition conditions, with regard to the surface of the nitride layer 104, the thickness of the oxide layer 106 deposited within the isolation area can be significantly less than thickness of the oxide layer 106 deposited within the dense area, as shown in FIG. 1C. Thereby, in the chemical mechanical planarization process of FIG. 1D, the oxide layer deposited within the isolation area tends to be more easily removed than that deposited within the dense area, causing apparent dishing defects in the isolation area, or even damaging part of the nitride layer in the isolation area (as shown by dash lines in the isolation area in FIG. 1E). In case of a trench having a larger width within an isolation area, for example, greater than or equal to 1 μm, defects shown in FIG. 1E are particularly significant.

In order to avoid the above defects, it is common in prior art practice to set a smaller removal amount in the chemical mechanical planarization process, which, however, might leave part of a deposited insulating layer on the surface of a device from being cleaned.

Therefore, it is desirable to provide a method capable of effectively addressing thickness difference between dense areas and isolation areas, and thus eliminate defects occurring in the chemical mechanical planarization process.

SUMMARY OF THE INVENTION

The present invention discloses methods of manufacturing a semiconductor device that eliminate or at least alleviate some or all of the problems identified above.

It has been found by the inventors that the deposition rate of a filling oxide layer is closely associated with the thickness of a liner oxide layer formed on bottom of a trench. Particularly, the thinner the liner oxide layer, the higher the deposition rate that can be achieved by the filling oxide layer; resulting in a thicker filling oxide layer deposited in the same period of time by removing the liner oxide layer on the bottom of the trench in the isolation area to reduce its thickness, one can decrease deposition thickness difference between the filling oxide layers deposited within the dense area and the isolation area, thus alleviating or eliminating disking defects or damages to the nitride layer.

One embodiment of this disclosure provides a method for manufacturing a semiconductor device, comprising: forming a nitride layer on a substrate, and forming trenches in an isolation area and trenches in a dense area; forming a first insulating layer on the bottom and sidewalls of the formed trenches in the isolation area and in the dense area; removing a portion of the first insulating layer, or all of the insulating layer thickness on the bottom of the trenches in the isolation area; depositing a second insulating layer to fill up the trenches in the isolation area and in the dense area; and with the nitride layer as a blocking layer, planarizing the second insulating layer outside the trenches in the isolation area and in the dense area by a chemical and mechanical planarization process.

In one embodiment, removing the first insulating layer comprises: forming a spacer layer over the first insulating layer on the sidewalls of the trenches in the isolation area and on the sidewalls and bottom of the trenches in the dense area; with the spacer layer as a mask, etching the first insulating layer on the bottom of the trenches in the isolation area; and removing the spacer layer.

In another embodiment, forming the spacer layer comprises: coating photoresist in the trenches in the isolation area and in the dense area; and removing, by a photolithography process, only the photoresist on the bottom of the trenches in the isolation area while the photoresist on the sidewalls of the trenches in the isolation area and on the sidewalls and bottom of the trenches in the dense area remains as the spacer layer.

In another embodiment, etching the first insulating layer on the bottom of the trenches in the isolation area comprises: removing a portion of or all of the thickness of the first insulating layer on the bottom of the trenches in the isolation area through a wet etching or dry etching process.

In one embodiment, the first insulating layer comprises an oxide layer.

In one embodiment, the first insulating layer is formed through a middle temperature oxide deposition (MTO).

In one embodiment, the first insulating layer formed on the bottom and sidewalls of the trenches in the isolation area and in the dense area has a thickness ranging from 10 Å to 100 Å.

In one embodiment, the second insulating layer comprises an oxide layer.

In one embodiment, the second insulating layer is made of high density plasma (HDP) oxides, high aspect ratio process (HARP) based oxides or spin on glass (SOG) based oxides.

In one embodiment, the trenches in the isolation area have a width greater than or equal to 1 µm.

In one embodiment, the spacer layer over the first insulating layer on the sidewalls of the trenches in the isolation area has a thickness ranging from 0.1 to 0.5 µm.

In one embodiment, etchant used in the wet etching process comprises hydrofluoric acid.

In one embodiment, in the chemical mechanical planarization process, the second insulating layer has a selectivity rate greater than 5 with respect to the nitride layer.

In one embodiment, in the chemical mechanical planarization process, the second insulating layer has a selectivity rate greater than 9 with respect to the nitride layer.

In one embodiment, the method further comprises an annealing step after the second insulating layer is deposited to fill up the trenches in the isolation area and in the dense area.

In one embodiment, the method further comprises a step of forming a lining oxide layer on the substrate before the nitride layer is formed.

In another aspect, one embodiment of this disclosure provides a semiconductor device, comprising: trenches in an isolation area and trenches in a dense area formed on a substrate; and an insulating layer, formed on the bottom and sidewalls of the trenches in the dense area, and on only the sidewalls of the trenches in the isolation area.

In one embodiment, the insulating layer has a thickness ranging from 10 Å to 100 Å.

In one embodiment, the trenches in the isolation area have a width greater than or equal to 1 µm.

By removing some or all of the thickness of the first insulating layer on the bottom of trenches in the isolation area, the method of the disclosed embodiments can improve the deposition rate for the trenches in the isolation area such that the difference in thickness for the deposited filling oxide layer between the isolation area and the dense area can be reduced, thereby alleviating or eliminating disking defects occurred in the chemical mechanical planarization process.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention. The same reference numerals in various drawings refer to the same parts or steps.

The present invention can be more clearly understood from the following detailed description with reference to the drawings, wherein:

FIGS. 5A-5C and FIG. 5E are cross sectional views schematically showing structure following various steps of an alternative embodiment for forming the semiconductor device structure shown in FIG. 4C.

FIG. 5D is an enlarged view of a portion of FIG. 5C.

DESCRIPTION OF THE EMBODIMENTS

Figure 1A:
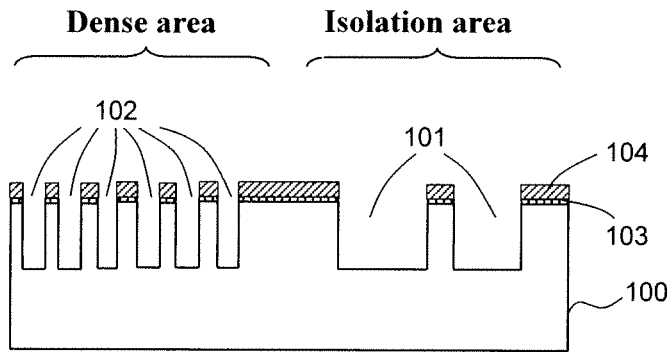
FIGS. 1A to 1D show the results of several steps of a prior art method of forming a semiconductor device with a shallow trench isolation structure.
Figure 1B:
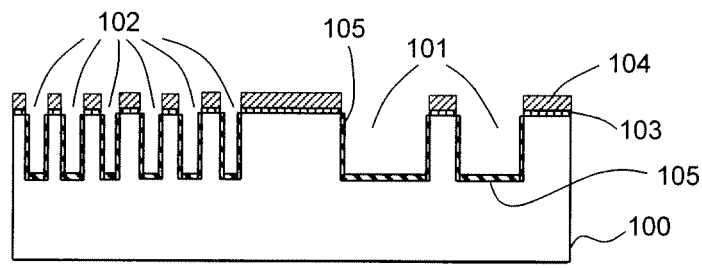

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

At the same time, it should be appreciated that, for the convenience of description, various parts shown in the figures are not illustrated in actual proportion.

The following description of at least one exemplary embodiment is merely illustrative in nature and is in no way intended to limit the invention, its application, or its uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Similar reference numerals and letters refer to similar items in the following figures, and thus once an item is defined in one figure, it is possible that it is not further discussed for the following figures.

It has been found experimentally by the inventors of this application that, after forming trenches and a first insulating layer, such as a liner oxide layer on inner walls of the trenches, when depositing a second insulating layer, such as a filling oxide layer in the trenches, the deposition rate of the second insulating layer is closely related to thickness of the first insulating layer formed on bottom of the trenches. The term "deposition rate" as used herein refers to thickness of a layer that is deposited in a time unit.

Figure 2:
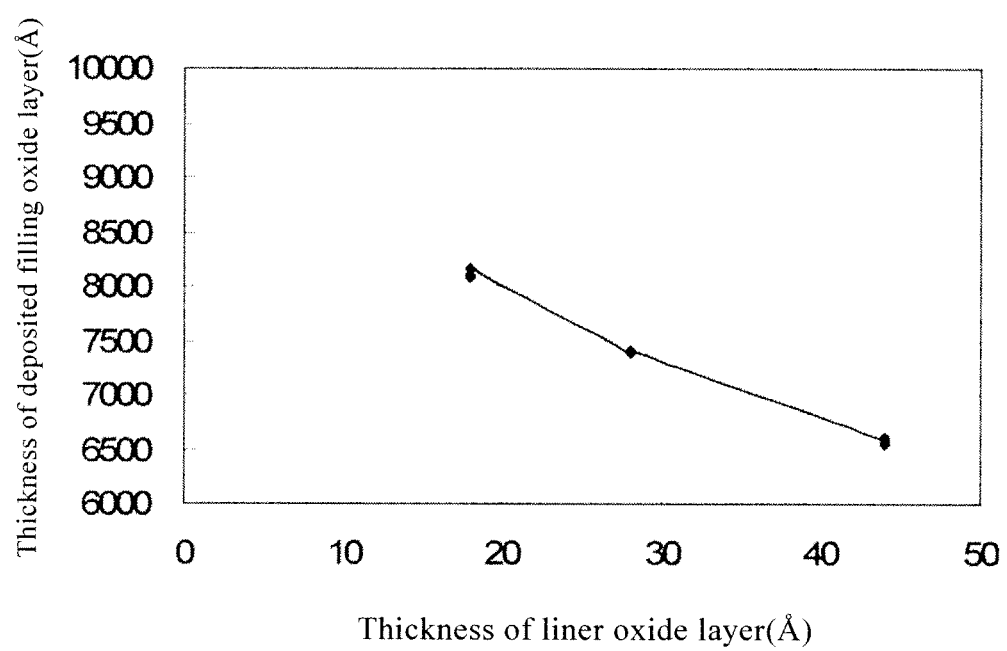
FIG. 2 is a graph showing a result of the deposition rate versus thickness of the liner oxide layer.

FIG. 2 is a graph showing a result of the deposition rate with respect to the thickness of the first insulating layer (a liner oxide layer, particularly, a layer of $SiO_2$, in an embodiment). In FIG. 2, the horizontal axis represents the thickness (in Å) of a liner oxide layer grown on the bottom of the trenches, and the vertical axis represents the thickness (in Å) of a filling oxide layer (also a layer of $SiO_2$ in this embodiment), which is formed under the same chemical vapour deposition conditions and then is subjected to an annealing process. The above experiment result is obtained from trenches having a width of about 50 µm and a depth of about 0.3 µm in a Si substrate.

It can be seen from the graph of FIG. 2, that the thinner the liner oxide layer on the bottom of the trenches is, the higher the deposition rate, or, the thicker the filling oxide layer obtained in a same period of time. It has been found by the inventors that a higher deposition rate can be achieved through directly depositing a filling oxide layer on a Si substrate as compared to depositing it on a liner oxide layer.

Based on the fact that a thinner liner oxide layer on the bottom of the trenches may lead to a higher subsequent deposition rate, in the embodiments herein, after forming trenches and a liner oxide layer and before depositing a filling oxide layer in the trenches, a step of removing a portion of or all of the thickness of the liner oxide layer on the bottom of trenches in an isolation area is added.

Through removing a portion of or all of the thickness of a liner oxide layer on the bottom of trenches in an isolation area, the method of the embodiments improves deposition rate for the trenches in the isolation area such that the difference in thickness for the deposited filling oxide layer between the isolation area and the dense area can be reduced, thereby alleviating or eliminating disking defects occurring in the chemical mechanical planarization process.

Figure 3:
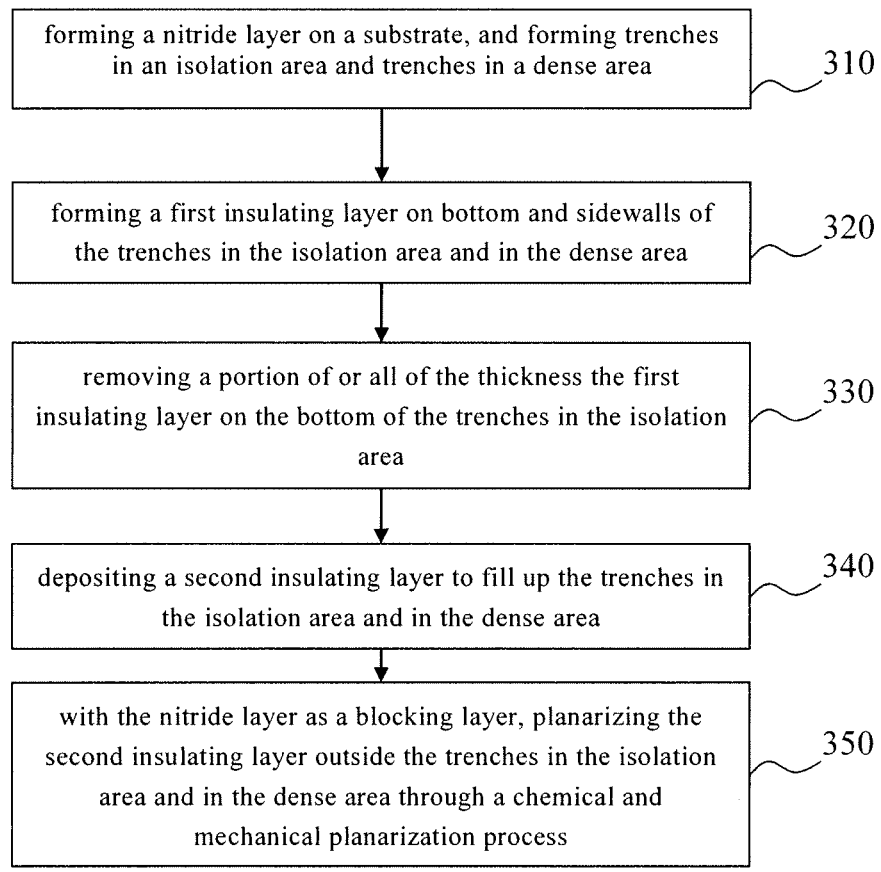
FIG. 3 schematically shows a flowchart of a method of forming a semiconductor device having a shallow trench isolation structure according to one embodiment of this disclosure.

FIG. 3 schematically shows a flowchart of a method of forming a semiconductor device having a shallow trench isolation structure according to one embodiment of the present invention. FIGS. 4A-4E are cross-sectional views schematically showing various structures of the method shown in FIG. 3 for forming the semiconductor device having a shallow trench isolation structure. FIGS. 5A-5E are cross sectional views schematically showing various structures in the formation of the semiconductor device structure shown in FIG. 4C according to one embodiment. Embodiments of the invention are described in detail with reference to FIG. 3, FIGS. 4A-4E and FIGS. 5A-5E.

Figure 4A:
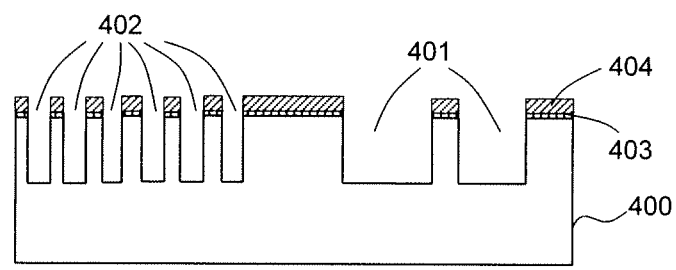
FIGS. 4A-4E are cross-sectional views schematically showing structure following various steps of the method shown in FIG. 3 for forming the semiconductor device having the shallow trench isolation structure.

At step 310 of FIG. 3, a semiconductor substrate 400 is provided, and trenches 401 and 402 are formed in an isolation area and in a dense area of the substrate 400, respectively (see FIG. 4A). Generally, as shown in the figure, trenches 401 in the isolation area have a width significantly greater than the width of trenches 402 in the dense area. For example, trenches 401 in the isolation area may have a width greater than or equal to 1 μm. The semiconductor substrate can be made of, for example, Si.

In some embodiments, there is a nitride layer 404 formed on the top of trenches 401 in the isolation area and trenches 402 in the dense area. The nitride layer 404 can be used to protect active areas in a subsequent process of depositing a filling oxide layer, and can be used as a blocking layer in a chemical mechanical planarization process. In some embodiments, there is also a lining oxide layer 403 formed beneath the nitride layer 404. The lining oxide layer 403 can be used to protect active areas from being chemically contaminated in a subsequent process of removing the nitride layer 404. The trenches 401, 402, lining oxide layer 403, and nitride layer 404 can be formed through any process that is known by those skilled in the art, and thus will not be described herein.

Figure 4B:
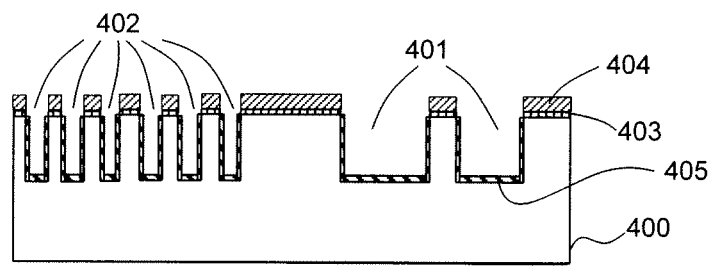

Next, at step 320 in FIG. 3, an insulating layer such as a liner oxide layer 405 is formed on the bottom and sidewalls of trenches 401 in the isolation area and trenches 402 in the dense area, as shown in FIG. 4B. For example, the liner oxide layer 405 can be formed by a middle temperature oxide deposition (MTO) layer through a low pressure chemical vapour deposition (LPCVD) process at a temperature of about 800° C. For example, the liner oxide layer 405 can be formed to be about 10 Å to 100 Å thick.

Figure 4C:
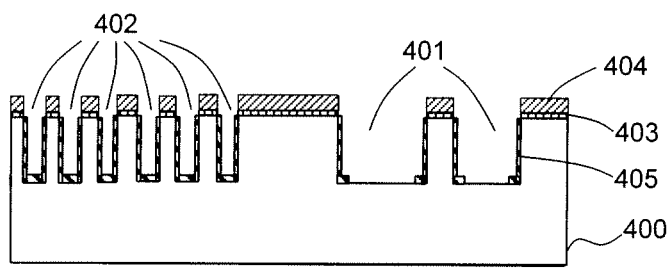

Then, at Step 330 of FIG. 3, based on the fact that a thinner liner oxide layer on the bottom of trenches may lead to a higher subsequent deposition rate, a portion of or all of the thickness of the liner oxide layer 405 on the bottom of trenches 401 in the isolation area can be removed as shown in FIG. 4C.

It should be noted that while removing the liner oxide layer on the bottom of trenches in the isolation area, it is necessary to ensure to not damage the liner oxide layer on the sidewalls. The liner oxide layer on the sidewalls of trenches in the isolation area can be used to prevent oxygen molecules from diffusing towards active areas in the anneal and oxide deposition processes, and improve the interface property between the substrate of Si and the deposited filling oxide layer. If the liner oxide layer on the sidewalls of trenches in the isolation area is damaged, it is not possible to achieve good isolation effects which may even lead to current leakage for semiconductor devices.

In order to get the structure shown in FIG. 4C by merely removing the liner oxide layer on the bottom of trenches in the isolation area, while protecting the liner oxide layer on the sidewalls from being removed, in one embodiment, a spacer layer covering the liner oxide layer 405 on the sidewalls of trenches 401 in the isolation area and on entirety of trenches 402 (including sidewalls and bottom) in the dense area can be formed.

Figure 5A:
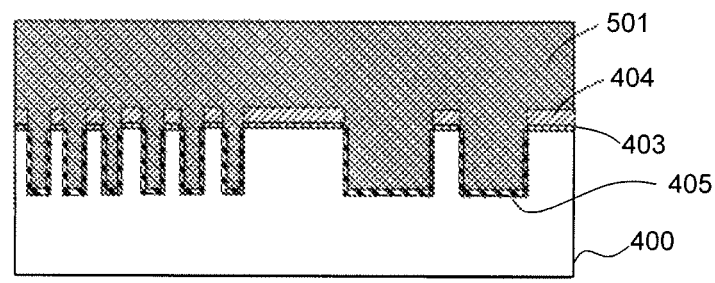
Figure 5B:
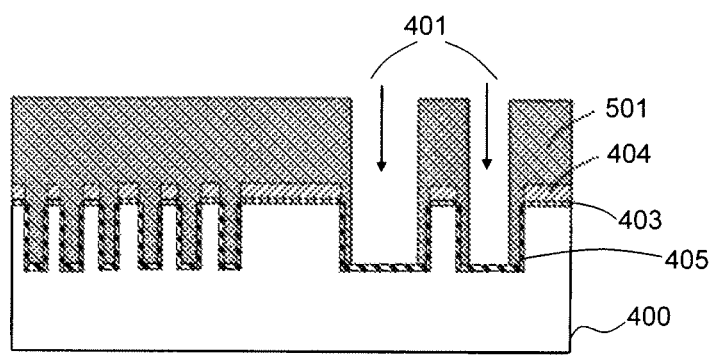

For example, as shown in FIG. 5A, photoresist 501 can be applied to trenches 401 in the isolation area and trenches 402 in the dense area. Then, by use of photolithography process, only the photoresist on the bottom of trenches 401 in the isolation area is removed, while the photoresist 501 on the sidewalls of trenches 401 in the isolation area and on the sidewalls and bottom of trenches 402 in the dense area remain as the spacer layer, as shown in FIG. 5B. In order to protect the liner oxide layer on the sidewalls from being damaged, preferably, the spacer layer 501 covering the sidewalls of trenches 401 in the isolation area has a thickness "a" of 0.1 μm to 0.5 μm, as shown in the enlarged view on the right side of FIG. 5C.

Next, using the spacer layer 501 as a mask, the liner oxide layer 405 on the bottom of trenches 401 in the isolation area is etched, as shown in FIGS. 5C and 5D. For example, a portion of or all of the thickness of the liner oxide layer 405 on the bottom of trenches 401 in the isolation area can be removed through a wet etching or dry etching process. In the case of trenches in the isolation area having a larger width, preferably, the liner oxide layer on the bottom of trenches 401 in the isolation area is completely etched away, until the substrate 400 is exposed.

In this example, materials can be appropriately selected for etchant and photoresist processing to ensure that the photoresist acting as the spacer layer cannot be corroded when etching the liner oxide layer on the trench bottom. For example, the etchant adopted in the wet etching process may comprise hydrofluoric acid, or other suitable etchant as appropriate. Last, as shown in FIG. 5E, the photoresist 501 acting as the spacer layer is removed so as to produce the semiconductor device structure shown in FIG. 4C.

Although it is described with reference to FIGS. 5A to 5E to remove a portion of or all of the thickness the liner oxide layer from the bottom of trenches in an isolation area by a combination of photolithography and etching processes, those skilled in the art will appreciate that the structure shown in FIG. 4C also can be obtained through other methods that are well known in the art.

Figure 4D:
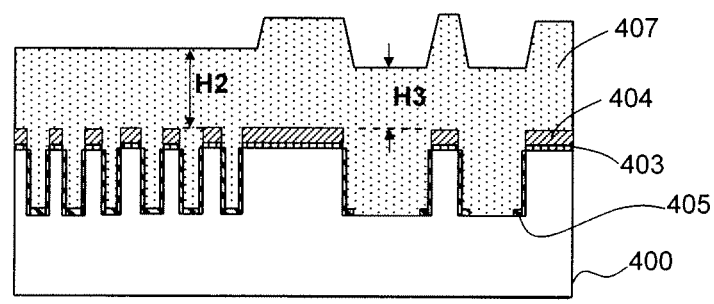

Referring to FIG. 3 again, at step 340, an insulating layer such as a filling oxide layer 407 is deposited on the resultant semiconductor device structure to fill the trenches 401 in the isolation area and the trenches 402 in the dense area, as shown in FIG. 4D. For example, the filling oxide layer 407 can be made of high density plasma (HDP) oxides obtained through a chemical vapour deposition (CVD) process, oxides obtained through a high aspect ratio process (HARP), or spin on glass (SOG) based oxides obtained through a plasma enhanced chemical vapour deposition (PECVD) process (for example, tetraethylorthosilicate (TEOS) glass and undoped silicate glass (USG)). Preferably, for the purpose of optimizing the performance of the semiconductor device, an annealing process is carried out on the resulting semiconductor device structure after the deposition of the filling oxide layer 407.

Figure 1C:
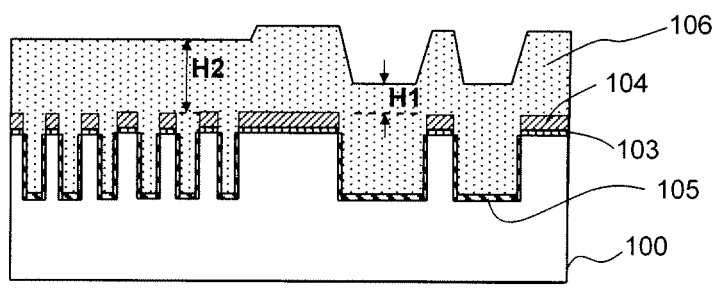
Figure 1D:
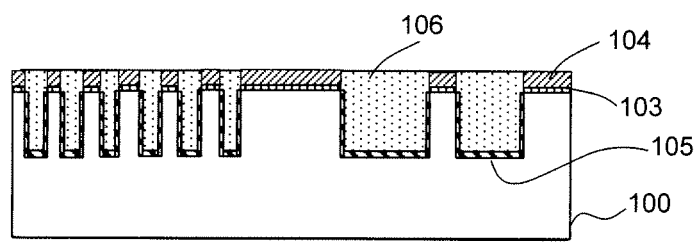
Figure 1E:
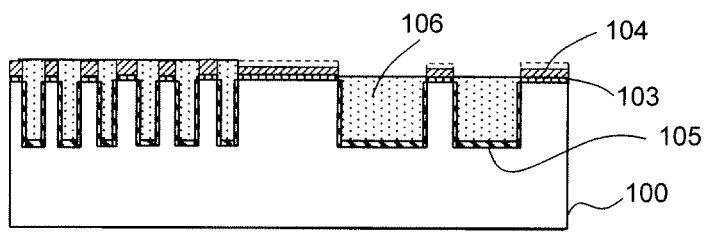
FIG. 1E shows disking defects and damages to the nitride layer caused by the prior art shallow trench isolation process.

In conjunction with the relationship of deposition rate and the thickness of the liner oxide layer on the trench bottom illustrated in FIG. 2, since a portion of or all of the thickness of the liner oxide layer 405 on the bottom of trenches 401 in the isolation area is removed at step 330, deposition rate of the filling oxide layer 407 for the trenches in the isolation area can be improved at step 340, so that as compared to the thickness H1 of prior art as shown in FIG. 1C, trenches in the isolation area as shown in FIG. 4D have a larger deposition thickness H3. Therefore, as compared to the prior art difference in deposition thickness (H2-H1) between trenches in a dense area and trenches in an isolation area, the embodiment disclosed can have a reduced difference in thickness (H2-H3) of the filling oxide layer deposited on a dense area and an isolation area.

Figure 4E:
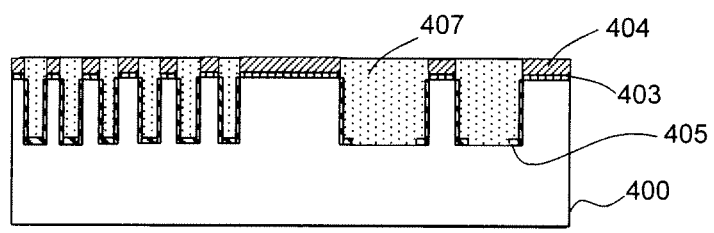

Last, at step 350 of FIG. 3, referring to FIG. 4E, taking the nitride layer 404 as a blocking layer, the filling oxide layer 407 outside trenches 401 in the isolation area and trenches 402 in the dense area can be removed through a chemical mechanical planarization process, so as to planarize the surface of the resulting device structure. In one embodiment, in the chemical mechanical planarization process, the filling oxide layer 407 has a selectivity rate greater than 5, preferably greater than 9, with respect to the nitride layer 404.

As shown in FIG. 4D, in the embodiments disclosed, since the filling oxide layer deposited on the trenches in the isolation area and on the trenches in the dense area tends to have a consistent thickness, in the chemical mechanical planarization process of step 350, process conditions for polishing the dense and isolation areas tend to be more consistent, and a structure having a flat surface as shown in FIG. 4E can be consequently obtained.

Through removing a portion of or all of the thickness of the liner oxide layer on the bottom of trenches in an isolation area the method of the disclosed embodiments can improve deposition rate of a filling oxide layer for the trenches in the isolation area so that the difference in thickness can be reduced for a filling oxide layer deposited on an isolation area and a dense area, thereby alleviating or eliminating disking defects occurred in the chemical and mechanical planarization process.

The method of fabricating semiconductor device has been described in detail according to embodiments of the present invention. Some details that are well known in the art are not discussed so not to obscure the concept of the present invention. From the above description, those skilled in the art can thoroughly understand how to implement the technique disclosed herein.

Although some specific embodiments of this invention have been illustrated in detail by way of examples, those skilled in the art will appreciate that the above examples are merely illustrative and are not intended to limit the scope of this invention. It should be understood by a person skilled in the art that the above embodiments can be modified without departing from the scope and spirit of the present invention. The scope of the present invention is defined by the attached claims.

What is claimed is:

1. A method for manufacturing a semiconductor device, comprising:
    forming a nitride layer on a substrate, and forming trenches in an isolation area and trenches in a dense area;
    forming a first liner insulating layer in the trenches in the isolation area and in the dense area, including on the bottom and sidewalls of the trenches, wherein the first liner insulating layer is in contact with the substrate;
    etching off a portion of or all of the thickness of the first liner insulating layer on the bottom of the trenches in the isolation area, the first liner insulating layer in the dense area remaining unetched during the etching;
    depositing a second insulating layer to fill up the trenches in the isolation area and in the dense area; and
    with the nitride layer as a blocking layer, planarizing the second insulating layer outside the trenches in the isolation area and in the dense area by a chemical and mechanical planarization process.

2. The method according to claim 1, wherein removing the first liner insulating layer comprises:
    forming a spacer layer over the first liner insulating layer on the sidewalls of the trenches in the isolation area and on the sidewalls and bottom of the trenches in the dense area;
    with the spacer layer as a mask, etching the first liner insulating layer on the bottom of the trenches in the isolation area; and
    removing the spacer layer.

3. The method according to claim 2, wherein forming the spacer layer comprises:
    coating photoresist in the trenches in the isolation area and in the dense area; and
    removing, by a photolithography process, only the photoresist on the bottom of the trenches in the isolation area while the photoresist remains on the sidewalls of the trenches in the isolation area and on the sidewalls and bottom of the trenches in the dense area as the spacer layer.

4. The method according to claim 2, wherein etching the first liner insulating layer on the bottom of the trenches in the isolation area comprises:
    removing a portion of or all of the thickness of the first liner insulating layer on the bottom of the trenches in the isolation area through a wet etching or dry etching process.

5. The method according to claim 1, wherein the first liner insulating layer comprises an oxide layer.

6. The method according to claim 5, wherein the first liner insulating layer is formed using middle temperature oxide deposition (MTO).

7. The method according to claim 6, wherein the first liner insulating layer formed on the bottom and sidewalls of the trenches in the isolation area and in the dense area has a thickness ranging from 10 Å to 100 Å.

8. The method according to claim 1, wherein the second insulating layer comprises an oxide layer.

9. The method according to claim 8, wherein the second insulating layer is made of one of high density plasma (HDP) oxides, high aspect ratio process (HARP) based oxides and spin on glass (SOG) based oxides.

10. The method according to claim 1, wherein the trenches in the isolation area have a width greater than or equal to 1 µm.

11. The method according to claim 2, wherein the spacer layer over the first liner insulating layer on the sidewalls of the trenches in the isolation area has a thickness ranging from 0.1 to 0.5 µm.

12. The method according to claim 4, wherein the wet etching process comprises the use of hydrofluoric acid.

13. The method according to claim 1, wherein in the chemical mechanical planarization process, the second insulating layer has a selectivity rate greater than 5 with respect to the nitride layer.

14. The method according to claim 13, wherein in the chemical mechanical planarization process, the second insulating layer has a selectivity rate greater than 9 with respect to the nitride layer.

15. The method according to claim 1, further comprising, after the second insulating layer is deposited, an annealing step after the second insulating layer is deposited to fill up the trenches in the isolation area and in the dense area.

16. The method according to claim 1, further comprising a step of forming a lining oxide layer on the substrate before the nitride layer is formed.

17. The method according to claim 1, wherein the first liner insulating layer is conformal to the trenches in the isolation area and the dense area.

* * * * *